United States Patent
Wang et al.

(10) Patent No.: US 8,652,641 B2
(45) Date of Patent: Feb. 18, 2014

(54) HEAT CONDUCTIVE DIELECTRIC POLYMER MATERIAL AND HEAT DISSIPATION SUBSTRATE CONTAINING THE SAME

(75) Inventors: David Shau Chew Wang, Taipei (TW); Yi An Sha, Taipei County (TW); Kuo Hsun Chen, Miaoli County (TW)

(73) Assignee: Polytronics Technology Corp., Hsinchu (TW)

( * ) Notice: Subject to any disclaimer, the term of this patent is extended or adjusted under 35 U.S.C. 154(b) by 217 days.

(21) Appl. No.: 13/109,284

(22) Filed: May 17, 2011

(65) Prior Publication Data

US 2011/0214852 A1    Sep. 8, 2011

(51) Int. Cl.
*B32B 15/08* (2006.01)
*B32B 27/38* (2006.01)

(52) U.S. Cl.
USPC ............................. 428/416; 428/414; 428/418

(58) Field of Classification Search
None
See application file for complete search history.

(56) References Cited

U.S. PATENT DOCUMENTS 8,003,216 B2 * 8/2011 Wang et al. .................. 428/416

OTHER PUBLICATIONS

Office Action dated Feb. 21, 2012 from Japan counterpart application 2007-045510.

\* cited by examiner

*Primary Examiner* — Craig Ricci
(74) *Attorney, Agent, or Firm* — WPAT, P.C.; Anthony King

(57) ABSTRACT

A heat conductive dielectric polymer material comprises a polymer, a curing agent and a heat conductive filler. The polymer comprises a thermoplastic and a thermosetting epoxy resin. The thermoplastic comprises 3% to 30% by volume of the heat conductive dielectric polymer material, and the thermosetting epoxy is selected from end-epoxy-function group epoxy resin, side chain epoxy function group epoxy resin, multi-function group epoxy resin or the mixture thereof. The curing agent can cure the thermosetting epoxy resin at a temperature. The heat conductive filler is uniformly distributed in the polymer and comprises 40% to 70% by volume of the heat conductive dielectric polymer material. The heat conductive dielectric polymer material has an interpenetrating network structure, and the heat conductive coefficient is greater than 1.0 W/m-K.

13 Claims, 1 Drawing Sheet

HEAT CONDUCTIVE DIELECTRIC POLYMER MATERIAL AND HEAT DISSIPATION SUBSTRATE CONTAINING THE SAME

CROSS REFERENCE TO RELATED APPLICATIONS

This application is a continuation in part of Ser. No. 11/699,710, filed Jan. 30, 2007, which claims the priority benefit of Taiwan patent application serial no. 095135494 filed on Sep. 26, 2006.

BACKGROUND OF THE INVENTION

1. Field of the Invention

The present invention relates to a solventless melt-shapeable thermally curable heat conductive dielectric polymer material, and more particularly relates to a heat dissipation substrate containing the same.

2. Description of the Related Art

In recent years, white LEDs have become a very popular new product attracting widespread attention all over the world. Because white LEDs offer the advantages of small size, low power consumption, long life, and quick response speed, the problems of conventional incandescent bulbs can be solved. Therefore, the applications of LEDs in backlight sources of displays, mini-projectors, illumination, and car lamp sources are becoming increasingly important in the market.

Although LEDs represent the future of illumination applications, many problems still remain unsolved. For example, with a high power LED for illumination, only about 15% to 20% of input power is converted into light, and the remaining 80% to 85% is converted into heat. If the heat is not dissipated to the environment efficiently, the temperature of the LED die becomes too high, thus influencing the light emitting intensity and service life of the LED die. Therefore, the heat management of LED devices is very important to performance and durability.

FIG. 1 shows a known heat dissipation substrate 10 for an electronic device such as an LED device (not shown). The heat dissipation substrate 10 includes a heat conductive dielectric material layer 12 and two metal foils 11 formed on upper and lower surfaces of the heat conductive dielectric material layer 12. The electronic device is placed on the upper metal foil 11. According to a known process for the heat dissipation substrate 10, a heat conductive filler (such as aluminum oxide grains) is added to liquid epoxy resin with various amount of solvents, and such mixture is blended with a curing agent to form a slurry. Then, the gas, which results from the evaporation of the solvent, in the slurry is removed by vacuum, and the slurry is daubed on the lower metal foil 11. The upper metal foil 11 is placed on the slurry to form a composite structure of metal foil/slurry/metal foil. The composite structure is then hot-pressed and cured to form the heat dissipation substrate 10. The resulting hot-pressed and cured slurry forms the heat conductive dielectric material layer 12.

However, the known process is restricted to the property of the slurry and has the following drawbacks: (1) The known process has to be finished within a certain time period; otherwise the slurry will cure and cannot be daubed on the metal foil, and the slurry is wasted. (2) While hot-pressing, some slurry overflows out of the metal foils 11. (3) When a temperature is reached during hot-pressing, separation of solid and fluid may occur, causing the conductive filler to be unevenly distributed in the heat conductive dielectric material layer 12 which reduces heat dissipation efficiency. (4) The storage of the slurry is not easy and sticky slurry limits the flexibility of the manufacturing process of the heat dissipation substrate. For example, the heat dissipation substrates with various shapes cannot be made efficiently, (5) There are some residual solvent in the dielectric layer to cause the evaporation of the solvent, formation of gas bubbles, and the interfacial delamination during the consecutive high temperature solder reflow process.

A traditional heat conductive circuit board can be manufactured by mixing liquid epoxy resin, solvents, a heat conductive filler and a curing agent to form a slurry, which is then coated on metal foil and heated to reach the B-stage before being hot-pressed to form a printed circuit board. Alternatively, a traditional FR-4 circuit board can also be manufactured by solution coating epoxy resin on a glass fiber cloth and heating the epoxy resin to B-stage, and then the glass fiber cloth is hot-pressed to form a glass fiber printed circuit board.

The above-mentioned conventional methods need low-viscosity slurry containing a lot of solvents; however, the solid filler portion and the liquid polymer solution portion may easily separate in a low-viscosity slurry due to the higher density of the conductive filler than that of the surrounding liquid matrix. The filler may naturally settle toward the bottom layer, causing non-uniform mixing and solid-liquid separation issue that affects heat dissipation efficiency. Furthermore, the slurry cannot be easily stored due to the solid-liquid separation problem as well as the shelf life issue.

Attempts were made to impregnate glass fiber cloth with the low viscosity slurry which includes thermal conductive fillers, solvents, and thermalset polymers. Due to the low thermal conductivity of glass fiber (about 0.36 W/mK), the heat conductive dielectric polymer material prepared from impregnated glass fiber usually has poor heat dissipation capability.

In summary, the low-viscosity slurry needed for known heat conductive circuit boards causes a problem in that the solid-liquid separation can easily occur. In addition, due to the low thermal conductivity of glass fiber, the printed circuit board made of glass fiber has poor heat dissipation. Thus, a new solventless melt-shapeable thermally curable heat conductive dielectric material serving as a high heat dissipation interface of a circuit board is required.

SUMMARY OF THE INVENTION

According to one aspect of the present invention, a solventless melt-shapeable thermally curable heat conductive dielectric polymer material has an interpenetrating network structure, and is rubbery, so as to increase processibility and heat dissipation.

According to another aspect of the present invention, a heat dissipation substrate having the solventless melt-shapeable thermally curable heat conductive dielectric polymer material exhibits superior heat dissipation efficiency and dielectric property and is able to withstand high voltage.

The present invention provides a solventless melt-shapeable thermally curable heat conductive dielectric polymer material having an interpenetrating network structure. The heat conductive dielectric polymer material includes a polymer, a curing agent and a heat conductive filler. The polymer includes a thermoplastic and a thermosetting epoxy resin. The curing agent is operable to cure the thermosetting epoxy resin at an elevated curing temperature. The heat conductive filler is uniformly distributed in the polymer. The solventless melt-shapeable thermally curable heat conductive dielectric polymer material has a heat conductive coefficient greater than 0.5

W/m-K, preferably greater than 1.0 W/m-K, most preferably greater than 1.5 W/m-K. The thermoplastic and thermosetting epoxy resin are mutually soluble to be homogeneous, by which the heat conductive filler can be uniformly distributed in the interpenetrating network structure for achieving optimal heat conductive performance. The thermoplastic comprises 10% to 75% by weight of the polymer. According to the thermoplastic property, the heat conductive dielectric material can be melt-shaped by thermoplastic process such as extrusion, calendaring, transfer molding, or injection molding, to form various shapes of articles, such as plaques, rods, curved parts.

Because the polymer matrix, including the thermoplastic resin and the thermosetting epoxy resin, can be cured and cross-linked at a high temperature to form an interpenetrating network structure, this cross-linked interpenetrating network structure exhibits the thermosetting plastic properties of withstanding high temperature and anti-deformation, and the thermoplastic properties of good flexibility, high toughness, and strong adhesion to metal electrodes or substrates. The heat conductive filler comprises 40% to 70% by volume of the heat conductive dielectric polymer material.

The present invention further provides a heat dissipation substrate including a first metal layer; a second metal layer and a heat conductive dielectric polymer material layer. The solventless melt-shapeable thermally curable heat conductive dielectric polymer material layer is disposed between and in physical contact with the first metal layer and the second metal layer. The metal layers and the polymer material may be combined by extrusion lamination or hot press lamination. The chemically surface treatment may be employed to the metal surface, or the filler surface, or the polymer matrix to improve the interfacial bonding among the filler particles, polymers, and metal surfaces. The solventless melt-shapeable thermally curable heat conductive dielectric polymer material has a heat conductive coefficient greater than 0.5 W/m-K. The heat dissipation substrate has a thickness less than 2.0 mm and can withstand a voltage greater than 1000 volts.

In another embodiment of the present invention, the solventless melt-shapeable thermally curable heat conductive dielectric polymer material includes a polymer, a curing agent and a heat conductive filler. The heat conductive dielectric polymer material layer includes a thermoplastic and a thermosetting epoxy resin; and the thermoplastic comprises 3% to 30% by volume of the heat conductive dielectric polymer material. The thermosetting epoxy resin is selected from end-epoxy-function group epoxy resin, side chain epoxy function group epoxy resin, tetra-function group epoxy resin or the mixture thereof. The curing agent is configured to cure the thermosetting epoxy resin at a curing temperature. The heat conductive filler is uniformly distributed in the polymer and comprises 40% to 70% by volume of the heat conductive dielectric polymer material. The heat conductive dielectric polymer material has an interpenetrating network structure, and the heat conductive coefficient is greater than 0.5 W/m-K, preferably greater than 1.0 W/m-K, most preferably greater than 1.5 W/m-K.

BRIEF DESCRIPTION OF THE DRAWINGS

The invention will be described according to the appended drawings in which.

DETAILED DESCRIPTION OF THE INVENTION

According to the present invention, a solventless melt-shapeable thermally curable heat conductive dielectric polymer material includes a polymer of an interpenetrating network structure, a curing agent and a heat conductive filler. The polymer includes a thermoplastic and a thermosetting epoxy resin, and the thermosetting epoxy resin comprises 10% to 75% by weight of the polymer. The curing agent is operable to cure the thermosetting epoxy resin. The heat conductive filler is evenly distributed in the polymer, and comprises 35% to 75%, preferably 40% to 70%, and most preferably 45% to 65%, by volume of the heat conductive dielectric polymer material. The heat conductive coefficient of the heat conductive dielectric polymer material is greater than 0.5 W/m-K, preferably greater than 1.0 W/m-K, and most preferably greater than 1.5 W/m-K.

Figure 1:
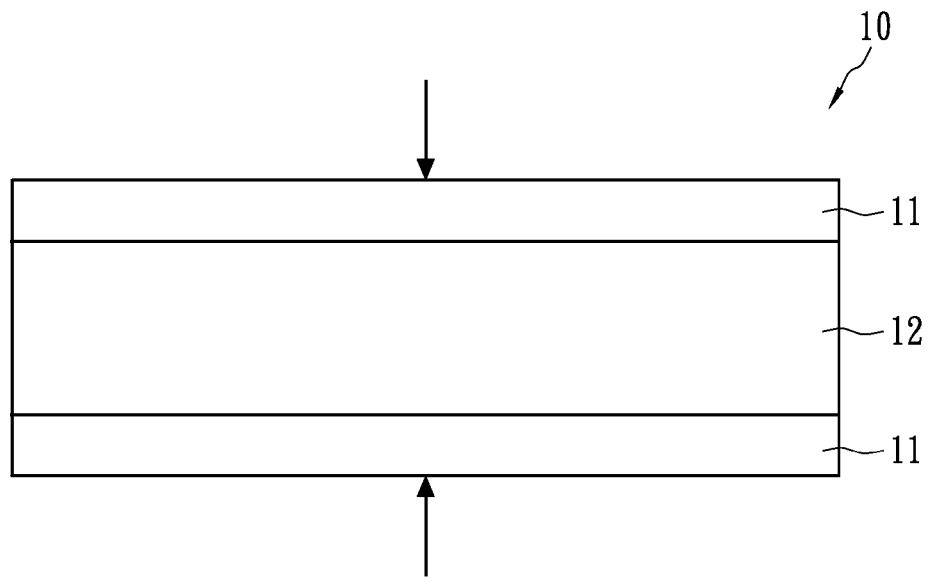
FIG. 1 shows a known heat dissipation substrate for an electronic device.
Figure 2:
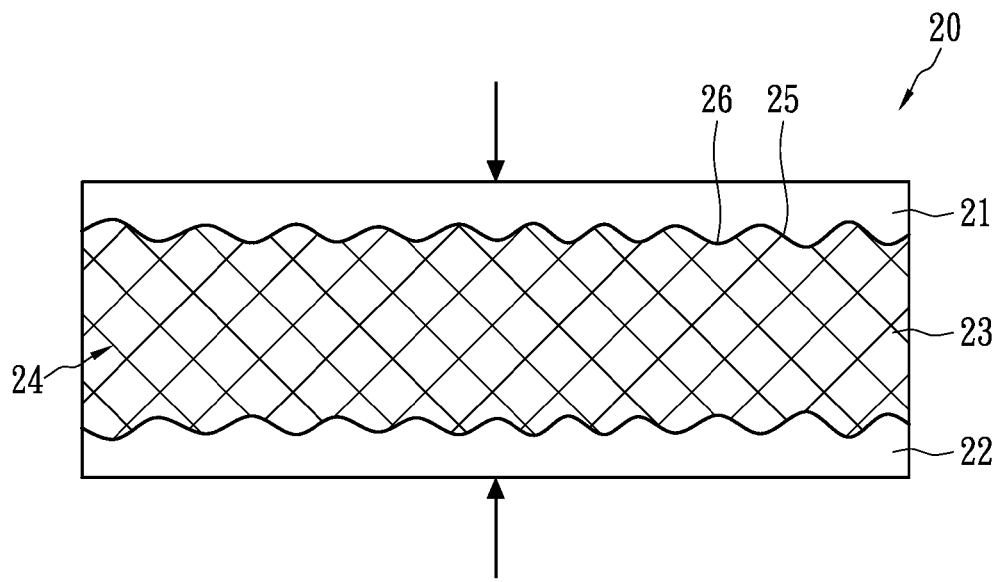
FIG. 2 shows a heat dissipation substrate in accordance with an embodiment of the present invention.

FIG. 2 shows a heat dissipation substrate 20 in accordance with the present invention. The heat dissipation substrate 20 includes a first metal layer 21, a second metal layer 22, and a solventless melt-shapeable thermally curable heat conductive dielectric polymer material layer 23 having an interpenetrating network structure 24. The interfaces between the first metal layer 21, the second metal layer 22 and the heat conductive dielectric polymer material layer 23 are physically contacted, and at least one of the interfaces is a micro-rough surface 25 having a plurality of nodules 26 with diameters primarily between 0.1 and 100 micrometers so as to increase the tensile strength therebetween. The plurality of nodules 26 may include copper, nickel, zinc or arsenic coatings, or organic silicon or organic titanium coatings.

The manufacturing methods of the heat conductive dielectric polymer material layer 23 and the heat dissipation substrate 20 are exemplified below. Initially, thermoplastic and thermosetting epoxy resin are blended at 200° C. for about 30 minutes to obtain a uniform mixture. The mixture is then uniformly mixed with the heat conductive filler to obtain a filler loaded rubbery material. The filler loaded rubbery material is discharged from the mixer into a catch pan to cool down to room temperature. Finally, an accelerator and a curing agent, and the filler loaded rubbery material are charged into a kneader and are melt mixed at 80° C. for additional 20 minutes to form a solventless melt-shapeable and thermally cureable rubbery material. The solventless melt-shapeable and thermally cureable rubbery material is placed between two release molds and is pressed under a pressure of 30 kg/cm² and at a temperature of 100° C. with a hot-press machine to form the solventless melt-shapeable thermally curable heat conductive dielectric polymer material layer 23, which is a sheet-like uncured heat conductive dielectric composite material. The two release molds are stripped from the upper and lower surfaces of the heat conductive dielectric polymer material layer 23. Sequentially, the heat conductive dielectric polymer material layer 23 is melt extruded at the temperature at least 30° C. below the curing temperature of the curing agent, and deposited between the first metal layer 21 and the second metal layer 22, and hot-pressed at 160° C. for 30 minutes to crosslink the heat conductive dielectric polymer layer, and to form a crosslinked heat dissipation substrate 20 with a thickness of, for example, 0.2 mm. The crosslinked sheet-like heat conductive dielectric composite material 24, which sandwiched between the first metal layer and the second metal layer, has an interpenetrating network structure which comprises the thermoplastic that can effectively mitigate material stress to keep substrate from bending that may occur after hot-pressing in prior art. Because the polymer has a relatively high viscosity coefficient (about $10^5$ to $10^7$ poise), the filler settling problem within the thermally conductive layer can be avoided. The first metal layer 21 and the second metal layer 22 may include copper, nickel, aluminum or metal formed by electro-plating or other manners. The sheet-like heat conductive dielectric composite material 23 is rubbery (not slurry-like), and therefore is easily stored and machined. In addition, the heat conductive dielectric composite material 23 can be machined by methods similar to those used for thermoplastic, such as extrusion lamination, transfer molding or injection molding, so as to enhance the processibility thereof.

Table 1 and Table 2 show the composition, appearance, heat conductivity and voltage endurance of the heat conductive dielectric polymer material of the heat dissipation substrate in accordance with four examples of the present invention and a comparative example. The thickness of the heat dissipation substrates of the examples and the comparative example are 0.2 mm.

TABLE 1

| | Composition (% by volume) | | | |
|---|---|---|---|---|
| | Heat conductive filler $Al_2O_3$ | Liquid epoxy resin DER331 | Curing agent 100S/UR500 | Thermoplastic Phenoxy |
| Example 1 | 40 | 42 | 2.5/0.21 | 15 |
| Example 2 | 60 | 28 | 1.7/0.14 | 10 |
| Example 3 | 60 | 19 | 1.1/0.1 | 20 |
| Example 4 | 70 | 23.5 | 1.4/0.12 | 5 |
| Comparative example | 60 | 38 | 2.3/0.19 | 0 |

TABLE 2

| | Appearance before curing | Separation (100° C.) | Melt Extrusion to sheet-like plaques | Heat conductive coefficient (W/m-K) | Breakdown voltage |
|---|---|---|---|---|---|
| Example 1 | Rubbery | No | Yes | 0.51 | 8.2 |
| Example 2 | Rubbery | No | Yes | 1.45 | 7.5 |
| Example 3 | Rubbery | No | Yes | 1.52 | 7.8 |
| Example 4 | Rubbery | No | Yes | 2.43 | 6.9 |
| Comparative example | Slurry-like | Yes | No | 1.48 | 7.4 |

The aluminum oxide (heat conductive filler) in Table 1 is a product of Denki Kagaku Kogyo Kabushiki Kaisya company and has an average diameter between 5 to 45 μm. Liquid epoxy resin is DER331™ of Dow Chemical Company and is a thermosetting epoxy resin. The curing agent is dicyandiamide, Dyhard 100S™ of Degussa Fine Chemicals, and an accelerator UR-500. The thermoplastic is an ultra high molecular weight phenoxy resin PKHH™ from Phenoxy Associates with a weight average Mw greater than 30000.

In Examples 1 to 4 of Tables 1 and 2, the heat conductive dielectric polymer material layer is rubbery and is suitable for melt extrusion and exhibits no separation during a 15 minutes storage period of time at 100° C. Moreover, in view of the heat conductive coefficient and breakdown voltage shown in Table 2, the four examples satisfy the requirement of the heat dissipation of electronic devices.

The thermoplastic and the thermosetting epoxy resin are substantially mutually soluble. That is, the thermoplastic and the thermosetting epoxy resin are mixed to form a solution having a single glass transition temperature. Because the thermoplastic and the thermosetting epoxy resin are mutually soluble, the thermoplastic will be dissolved in the thermosetting epoxy resin when they are mixed. Accordingly, the glass transition temperature of the thermoplastic is substantially decreased; allowing the mixture to occur at a temperature below the normal softening temperature of the thermoplastic. The mixture (i.e., the polymer) is rubbery or in solid state at room temperature, and therefore is easily weighed and stored. For example, even if the thermosetting epoxy resin is a tacky liquid epoxy resin, the mixture of the thermosetting epoxy resin and the thermoplastic can be made to form a non-tacky tough leathery film at room temperature. At a temperature below the bulk Tg of the polymer mixture, the polymer mixture acts like a glassy solid and has a relatively high viscosity (about $10^5$ to $10^7$ poise), so as to prevent fillers from settling or redistribution in the polymer. Moreover, at a general mixing temperature (between approximately 25 and 100° C.) above the bulk Tg of the polymer mixture, but below the curing temperature, the polymer mixture is in the melt-shapeable state and has a sufficiently low viscosity (about $10^4$ to $10^5$ poise) to allow the addition of the curing agent and the heat conductive filler to be uniformly distributed in the mixture. Many exemplary mixtures can be found in U.S. patent application Ser. No. 07/609,682 and PCT Patent Publication No. WO92/08073 (published 14 May 1992) incorporated herein by reference.

The curing agent used to cure (i.e., crosslink) or catalytic-polymerize the thermosetting epoxy resin in the heat conductive dielectric material may have a curing temperature $T_{cure}$ of higher than 125° C. The curing agent is used to quickly cure the thermosetting epoxy resin at a curing temperature at least 25° C., preferably 50° C., and most preferably 75° C. higher than the mixing temperature $T_{mix}$, wherein the mixing temperature $T_{mix}$ herein means a temperature at which the thermoplastic, the thermosetting epoxy resin, and the curing agent are mixed. The mixing temperature $T_{mix}$ can usually be between approximately 25 and 100° C. When a curing agent is added at the mixing temperature $T_{mix}$, the curing reaction is negligible. The amount of the curing agent added in the present invention can cause the thermosetting epoxy resin to be cured at a temperature higher than the mixing temperature $T_{mix}$. Preferably, the curing agent will not start a substantial curing reaction at a temperature of lower than about 100° C. Accordingly, the heat conductive dielectric polymer material can remain substantially uncured at 25° C. for at least half a year.

In addition to the above-mentioned materials shown in Tables 1 and 2, the thermoplastic in the heat conductive dielectric material can be selected from the substantially amorphous thermoplastic resin, and the definition of the resin can be found by referring to page 1 of "Saechtling International Plastic Handbook for the Technology, Engineer and User, Second Edition, 1987, Hanser Publishers, Munich."

The term "substantially amorphous" means that the proportion of the part of "crystallinity" in the resin is at most 15%, and preferably 10%, and especially preferably 5%, for example, a crystallinity of 0 to 5%. The substantially amorphous thermoplastic resin is a high-molecular polymer, which is rigid or rubbery at room temperature, and the above polymer component is used for providing the properties of strength and high viscosity. The substantially amorphous thermoplastic resin usually can be in an amount of 10% to 75% by volume based on total polymer volume, preferably 15% to 60%, and especially preferably 25% to 45% of the polymer. The substantially amorphous thermoplastic resin can be selected from the group consisting essentially of polysulfone, polyethersulfone, polystyrene, polyphenylene oxide, polyphenylene sulfide, polyamide, phenoxy resin, polyimide, polyetherimide, polyetherimide/silicone block copolymer, polyurethane, polyester, polycarbonate, and acrylic resin (e.g., polymethyl methacrylate, styrene/Acrylonitrile, and styrene block copolymers).

Moreover, the thermoplastic preferably includes a hydroxy-phenoxyether polymer structure. The hydroxy-phenoxyether is formed by a polymerization reaction of the stoichiometric mixture including diepoxide and difunctional species. The diepoxide is an epoxy resin with an epoxy equivalent weight of about 100 to 10000. For example, the diepoxide can be diglycidyl ether of bisphenol A, diglycidyl ether of 4,4'-sulfonylbisphenol, diglycidyl ether of 4,4'-oxybisphenol, diglycidyl ether of 4,4'-dihydroxybenzophenone, diglycidyl ether of hydroquinone, or diglycidyl ether of 9,9-(4-hydroxyphenyl) fluorine. The difunctional species is dihydric phenol, dicarboxylic acid, primary amine, dithiol, disulfonamide, or bis-secondary amine. The dihydric phenol is selected from the group consisting essentially of 4,4'-isopropylidene bisphenol (bisphenol A), 4,4'-sulfonylbisphenol, 4,4'-oxybisphenol, 4,4'-dihydroxybenzophenone, and 9,9-bis (4-hydroxyphenyl) carbazole. The dicarboxylic acid is selected from the group consisting essentially of isophthalic acid, terephthalamic acid, 4,4'-biphenylenedicarboxylic acid, and 2,6-naphthalenedicarboxylic acid. The bis-secondary amine is selected from the group consisting essentially of piperazine, dimethyl piperazine, and 1,2-bis(N-aminomethyl)ethane. The primary amine is selected from the group consisting essentially of 4-methoxyaniline and 2-aminoethanol. The dithiol is 4,4'-dimercaptodiphenyl ether. The disulfonamide is selected from the group consisting essentially of N,N'-dimethyl-1,3-benzenedisulfonamide, and N,N'-bis(2-hydroxyethyl)-4,4-biphenyldisulfonamide. Moreover, the difunctional species also includes a mixture comprising two different functional groups for reaction with the epoxide group, for example, salicylic acid and 4-hydroxybenzoic acid.

The thermoplastic in the heat conductive dielectric polymer material of the present invention can be a reaction product of liquid epoxy resin with bisphenol A, bisphenol F, or bisphenol S, a reaction product of liquid epoxy resin with a divalent acid, or a reaction product of liquid epoxy resin with amines.

In addition to that shown in Table 1, the thermosetting epoxy resin in the heat conductive dielectric polymer material of the present invention also can be selected from the thermosetting epoxy resin defined in "Saechtling International Plastic Handbook for the Technology, Engineer and User, 2nd (1987), pp. 1-2, Hanser Publishers, Munich." The polymer usually comprises 25% to 90%, preferably 40% to 85%, and especially preferably 55% to 75% by volume of the thermosetting epoxy resin. The volume ratio of the substantially amorphous thermoplastic resin to the thermosetting resin in the polymer ranges from about 1:9 to 3:1. The thermosetting resin preferably has a functional group of larger than 2. At room temperature, the thermosetting resin is liquid or solid. If it is cured without adding any thermoplastic resin, the thermosetting resin is brittle or rubbery. The thermosetting resin is preferably uncured epoxy resin, and especially uncured epoxy resin defined by ASTM D 1763. The liquid epoxy resin can be further understood by referring to the description in "Engineered Materials Handbook, Engineering Plastics, Volume 2, and pp. 204-241. Publisher: ASM International Page 240-241." The term "epoxy resin" refers to a conventional dimeric epoxy resin, an oligomeric epoxy resin, or a polymeric resin, which includes at least two epoxy functional groups. The epoxy resin is a reaction product of bisphenol A with epichlorohydrin, a reaction product (novolac resin) of phenol with formaldehyde, a reaction product of epichlorohydrin, cycloaliphatics, peracid epoxy resin with glyceryl ether, a reaction product of epichlorohydrin with p-amino phenol, a reaction product of epichlorohydrin with glyoxal tetraphenol, phenolic epoxy resin or bisphenol A epoxy resin. Commercially available epoxide is preferably 3,4-epoxycyclohexylmethyl 3,4-epoxycyclohexane formate (e.g., ERL 4221 of Union Carbide Company or CY-179 of Ciba Geigy Company) or bis(3,4-epoxycyclohexylmethyl) adipate (e.g., ERL 4299 of the Union Carbide Company). Commercially available diglycidyl ether of bisphenol A (DGEBA) is selected from Araldite 6010 of Ciba Geigy Company, DER 331 of Dow Chemical Company, and Epon 825, 828, 826, 830, 834, 836, 1001, 1004, or 1007 of Shell Chemical Company. Moreover, the polyepoxidized phenol formaldehyde novolac prepolymer is selected form DEN 431 or 438 of Dow Chemical Company and CY-281 of Ciba Geigy Company. The polyepoxidized cersol formaldehyde novolac prepolymer is selected from ENC 1285, 1280, or 1299 of Ciba Geigy Company. The poly polyol glycidyl ether is selected from Araldite RD-2 (based on butyl-1,4-diol) of the Ciba Geigy Company or Epon 812 (based on glycerol) of Shell Chemical Company. A suitable diepoxide of alkyl cycloalkylhydrocarbon is vinyl cyclohexane dioxide, e.g., ERL 4206 of Union Carbide Company. Moreover, a suitable diepoxide of cycloalkyl ether is bis(2,3-diepoxycyclopentyl)-ether, e.g., ERL 0400 of Union Carbide Company. Moreover, the commercially available flexible epoxy resin includes polyglycol diepoxy (e.g., DER 732 and 736 of the Dow Chemical Company), diglycidyl ether of linoleic dimmer acid (e.g., Epon 871 and 872 of Shell Chemical Company), and diglycidyl ether of bisphenol, wherein the aromatic ring is connected by a long aliphatic chain (e.g., Lekutherm X-80 of the Mobay Chemical Company).

Moreover, the thermosetting epoxy resin having multiple functional groups is selected from DEN 4875 (namely, a solid novolac resin) of Dow Chemical Company, Epon 1031 (tetrafunctional solid epoxy resin) of Shell Chemical Company and Araldite MY 720 (N,N, N',N'-tetraglycidyl-4,4'-methylene dianiline) of Ciba-Geigy Company. Moreover, the difunctional epoxy resin (dicyclic oxide) is selected from HPT 1071 (solid resin, N,N, N',N'-tetraglycidyl-a,a'-bis(4-aminophenyl) P-Di-Isopropylbenzene), HPT 1079 of Shell Chemical Company (solid diglycidyl ether of bisphenol-9-carbazole) or Araldite 0500/0510 (tridiglycidyl ether of p-aminophenol) of Ciba-Geigy Company.

The curing agent used in the present invention is selected from isophthaloyl dihydrazide, benzophenone tetracarboxylic dianhydride, diethyltoluene diamine, 3,5-dimethylthio-2, 4-toluene diamine, dicyandiamide (obtained from Curazol 2PHZ of the American Cyanamid Company) or DDS (diaminodiphenyl sulfone, obtained from Calcure of Ciba-Geigy Company). The curing agent is selected from the substituted dicyandiamide (e.g., 2,6-xylylbiguanide), solid polyamide (e.g., HT-939 of Ciba-Geigy Company or Ancamine 2014AS of Pacific Anchor Company), solid aromatic amine (e.g., HPT 1061 and 1062 of Shell Chemical Company), solid anhydride hardener (e.g., pyromellitic dianhydride (PMDA)), phenolic resin hardener (e.g., poly(p-hydroxy styrene), imidazole, the adduct of 2-phenyl-2,4-dihydroxymethylimizole and 2,4-diamino-6[2'-methylimizole(1)]ethyl-s-triazinylisocyanate), boron trifluoride, and amine complex (e.g., Anchor 1222 and 1907 of Pacific Anchor Company), and trimethylol propane triacrylate.

As for the thermosetting epoxy resin, the curing agent is preferably dicyandiamide and is used together with a curing accelerator. The commonly used curing accelerator includes urea or urea compounds, for example, 3-phenyl-1,1-dimethylurea, 3-(4-chlorophenyl)-1,1-dimethylurea, 3-(3,4-dichlorophenyl)-1,1-dimethylurea, 3-(3-chloro-4-methylphenyl)-1,1-dimethylurea and imidazole (e.g., 2-heptadecylimidazole, 1-cyanoethyl-2-phenylimidazole-trimellitate, or 2-[β-{2'-methylimidazol-(1')}]-ethyl-4,6-diamino-s-triazinyl).

If the thermosetting epoxy resin is urethane, then the curing agent can use blocked isocyanate, (e.g., alkyl phenol blocked isocyanate selected from Desmocap 11A of Mobay Corporation) or phenol blocked polyisocyanate adduct (e.g., Mondur S of Mobay Corporation). If the thermosetting epoxy resin is unsaturated polyester resin, then the curing agent can use peroxide or other free radical catalysts, such as dicumyl peroxide, 2,5-dimethyl-2,5-di(t-butylperoxy)hexane, t-butyl cumyl peroxide, and 2,5-dimethyl-2,5-di(t-butylperoxy)-3-hexyne. Moreover, the unsaturated polyester resin is crosslinked through radiation (e.g., an ultraviolet radiation, a high-power electron beam, or γ radiation).

Some thermosetting epoxy resin can be cured without using a curing agent. For example, if the thermosetting epoxy resin is a bismaleimide (BMI), the BMI is crosslinked at a high temperature, and a co-curing agent (e.g., O,O'-diallyl bisphenol A) may be added together to make the cured BMI tougher.

The above-mentioned resin cross-linked using a peroxide crosslinker, high-power electron beam, or γ radiation is preferably added with an unsaturated cross-linking agent, e.g., triallyl isocyanurate (TAIC), triallyl cyanurate (TAC) or TMPTA.

The above-mentioned heat conductive filler can be selected from a nitride, an oxide and mixture thereof. The nitride can be selected from the group consisting essentially of zirconium nitride, boron nitride, aluminum nitride, and silicon nitride. The oxide can be selected from the group consisting essentially of aluminum oxide, magnesium oxide, zinc oxide, and titanium dioxide.

In another embodiment, the polymer mixture includes thermoplastic and thermosetting epoxy resin; the thermoplastic comprises 1% to 50%, preferably 3% to 30% by volume of the polymer mixture. The above-mentioned thermoplastic may include an ultra-high molecular weight phenoxy resin, wherein the ultra-high molecular weight phenoxy resin may have a molecular weight of greater than 30000. The thermoplastic is selected from hydroxy phenoxy ether polymer (also known as phenoxy resin), hydroxyl ester ether polymer, hydroxyl amino ether polymer, and the mixture thereof. In an embodiment, diepoxide is polymerized with difunctional species to yield the hydroxy phenoxy ether polymer. The thermoplastic can be generated by reacting the liquid epoxy resin with the bisphenol A, the liquid epoxy resin with a divalent acid, or the liquid epoxy resin with amines.

The above-mentioned thermosetting epoxy resin may be an uncured liquid epoxy resin, a polymerized epoxy resin, a phenolic epoxy resin or a bisphenol A epoxy resin. The thermosetting epoxy resin may be a mixture of a plurality of epoxy resins, and may include end-epoxy-function group epoxy resin, side chain epoxy function group epoxy resin, multi-function group epoxy resin, or the combination thereof. The amount of the thermosetting epoxy resin can be in a range of from 50% to 99%, preferably from 70% to 97% by volume of the polymer. The thermosetting epoxy resin can be cured by a curing agent at a temperature above 80° C. The side-chain epoxy function group epoxy resin may use NAN YA Plastic corporation NPCN series, e.g., NPCN-703, or Chang Chun Group BNE-200.

Likewise, the heat conductive filler may include one or more ceramic powders that can be selected from a nitride, an oxide or the mixture thereof. The nitride can be selected from the group consisting essentially of zirconium nitride, boron nitride, aluminum nitride, and silicon nitride. The oxide can be selected from the group consisting essentially of aluminum oxide, magnesium oxide, zinc oxide, silicon dioxide and titanium dioxide. In general, oxide's heat conductivity is relatively low, whereas the filling amount of nitride is relatively low. Therefore, the mixed oxide and nitride are complementary to each other.

For example, the dielectric material can be made by the following method. The polymer including the thermoplastic and the thermosetting epoxy resin are blended and heated at around 200° C. for 30 minutes to form a uniform glue. The heat conductive filler is added to the uniform glue to form a uniform rubbery material, and then the curing agent (Dicy) and the accelerator are added to the uniform rubbery material at 80° C. to form the dielectric material. The uniform rubbery material has an interpenetrating network structure. Because the thermoplastic and the thermosetting epoxy resin are mutually soluble and the high viscosity of the homogeneous polymer mixture keeps the filler particles from settling, the thermal conductive filler is uniformly distributed in the interpenetrating network structure to achieve superior heat conductive efficiency.

The solventless melt-shapeable thermally curable heat conductive dielectric material exhibits the thermoplastic characteristics. Hence it can be melt-shaped by thermoplastic processing methods, such as extrusion lamination, injection molding, transfer molding, etc., at the temperature range from 25° C. to 100° C. The heat conductive dielectric material also exhibits thermoset plastic characteristics. It can be thermally cross-linked at an elevated temperature above 125° C. to form an cross-linked interpenetrating network structure. This thermally cross-linked interpenetrating network structure has good high temperature deformation resistance, and has tenacious, ductile characteristics. It can strongly adhere to metal electrodes or a substrate.

Table 3 shows the composition of the heat conductive dielectric material of some examples of the present invention. The heat dissipation substrate has a thickness greater than 0.1 mm and is capable of withstanding a voltage greater than 2000 volts.

The thermoplastic includes phenoxy resin in the amount of 3% to 30% by volume of the dielectric material. The thermosetting epoxy resin may include bisphenol A epoxy resin and multifunctional group epoxy resin. The multifunctional group epoxy resin includes side chain epoxy functional epoxy resin and tetrafunctional epoxy resin. The heat conductive filler includes aluminum oxide that may be further added by boron nitride and aluminum nitride. The heat conductive filler is 35% to 75%, preferably 40% to 70%, most preferably 45% to 65%, by volume of the dielectric material. In an embodiment, the curing agent is Dicy (dicyandiamide). As shown in Table 3, the dielectric materials of Example 4 and 5 formed by adding aluminum nitride have relatively high heat conductivity. Examples 1 to 5 have superior insulating behavior and all pass the high pressure and high humidity test at 2 atmospheres pressure and 121° C. for 48 hours. Moreover, the examples in which the aluminum nitride or boron nitride is added (Examples 4 and 5) have better heat conductivity.

TABLE 3

|  |  | Example 1 | Example 2 | Example 3 | Example 4 | Example 5 |
|---|---|---|---|---|---|---|
| Composition (vol %) | Biphenol A epoxy resin | 12 | 24 | 23 | 23 | 23 |
|  | Multi-functional group epoxy resin | 8 | 10 | 13 | 16 | 16 |
|  | phenoxy resin | 30 | 8 | 6 | 3 | 3 |
|  | Aluminum oxide | 50 | 58 | 58 | 53 | 53 |
|  | Boron nitride | 0 | 0 | 0 | 0 | 5 |
|  | Aluminum nitride | 0 | 0 | 0 | 5 | 0 |
|  | Curing agent | Dicy | Dicy | Dicy | Dicy | Dicy |
| Physical Properties | Heat conductivity (W/m-K) | 1.5 | 1.8 | 1.8 | 4.5 | 3.9 |
|  | Glass transition temperature | 105 | 130 | 140 | 150 | 150 |
|  | Peeling strength (kg/cm) | 1.85 | 1.82 | 1.86 | 1.61 | 1.52 |
|  | Insulating voltage endurance (kV/mm) | 52 | 48 | 51 | 50 | 55 |
|  | High pressure high humidity test (48 hours) | Pass | Pass | Pass | Pass | Pass |

Table 4 shows comparative examples in which the dielectric material is the same as that in Table 1 but is of a different percentage. Comparative Example 6 includes aluminum nitride of high volume percentage such as 42% serving as the heat conductive filler. Although aluminum nitride has excellent heat conductivity, aluminum nitride easily forms aluminum oxide and releases ammonia under retort condition. Accordingly, Comparative Example 6 fails to pass the test of high pressure and high humidity for 48 hours. In Comparative Example 7, the dielectric material containing the boron nitride has superior heat conductivity. However, the boron nitride is a flake-like and low-friction filler, which results in poor adhesion strength between the dielectric material and the metal substrate. Therefore, the amount of added boron nitride has a certain limit

TABLE 4

|  |  | Comparative example 6 | Comparative example 7 |
|---|---|---|---|
| Composition (vol %) | Biphenol A epoxy resin | 32 | 25 |
|  | Multi-functional group epoxy resin | 14 | 11 |
|  | Phenoxy resin | 12 | 10 |
|  | Aluminum oxide | 0 | 0 |
|  | Boron nitride | 0 | 54 |
|  | Aluminum nitride | 42 | 0 |
|  | Curing agent | Dicy | Dicy |
|  | Heat conductivity (W/m-K) | 3.9 W/m-K | 1.8 W/m-K |
|  | Glass transition temperature | 130 | 130 |
|  | Peeling strength (kg/cm) | 1.81 | 0.8 |
|  | Insulating voltage endurance (kV/mm) | 50 | 48 |
|  | High pressure/high humidity test (48 hours) | Fail | Pass |

Like FIG. 2, the above heat conductive dielectric polymer material can be formed to be included in a heat dissipation substrate, and there may be rough surfaces between the heat conductive dielectric polymer material layer and first and second metal layers and the rough surface may have plural nodules. In an embodiment, the heat dissipation substrate has a thickness greater than 0.1 mm and can withstand a voltage greater than 500 volts, preferably greater than 2000 volts, most preferably greater than 3000 volts.

During a hot pressing process, the heat conductive dielectric material does not have the solid-liquid separation issue due to the interpenetrating network structure thereof. The metal layers are made by the group consisting of copper, aluminum, nickel, copper alloy, aluminum alloy, nickel alloy, copper nickel alloy, and copper aluminum alloy. The heat conductive dielectric material appears more like rubbery than slurry, and therefore it can be conveniently stored and easily processed. In addition, the heat conductive dielectric material can be processed by the methods for thermoplastic, exhibiting excellent processability.

The above-described embodiments of the present invention are intended to be illustrative only. Numerous alternative embodiments may be devised by persons skilled in the art without departing from the scope of the following claims.

What is claimed is:
1. A solventless melt-shapeable thermally curable heat conductive dielectric polymer material, comprising:
   a polymer mixture comprising a thermoplastic and a thermosetting epoxy resin, wherein the thermoplastic comprises 3% to 8% by volume of the heat conductive dielectric polymer material; the thermoplastic and thermosetting epoxy resin are mutually soluble; and the thermosetting epoxy resin comprises multi-functional group epoxy resin;
   a curing agent operable to cure the thermosetting epoxy resin at a curing temperature; and
   a heat conductive filler uniformly distributed in the polymer; comprising 40% to 58% by volume of the heat conductive dielectric polymer material;
   wherein the heat conductive dielectric polymer material has an interpenetrating structure, which is melt-shapeable at the temperature from 25° C. to 100° C. and can be thermally crosslinked at an elevated temperature above 125° C., and a heat conductive coefficient equal to or greater than 1.8 W/m-K.

2. The heat conductive dielectric polymer material of claim 1, wherein the thermoplastic comprises phenoxy resin.

3. The heat conductive dielectric polymer material of claim 2, wherein the phenoxy resin has a molecular weight of greater than 30000.

4. The heat conductive dielectric polymer material of claim 2, wherein the phenoxy resin comprises hydroxy phenoxy ether polymer.

5. The heat conductive dielectric polymer material of claim 1, wherein the thermoplastic comprises hydroxyl ester ether polymer, hydroxyl amino ether polymer or the mixture thereof.

6. The heat conductive dielectric polymer material of claim 1, wherein the multifunctional group epoxy resin comprises side chain epoxy functional epoxy resin or tetrafunctional epoxy resin.

7. The heat conductive dielectric polymer material of claim 1, wherein the thermosetting epoxy resin further comprises bisphenol A epoxy resin.

8. The heat conductive dielectric polymer material of claim 1, wherein the heat conductive filler comprises aluminum oxide.

9. The heat conductive dielectric polymer material of claim 8, wherein the heat conductive filler further comprises zirconium nitride, boron nitride, aluminum nitride or silicone nitride.

10. The heat conductive dielectric polymer material of claim 8, wherein the heat conductive filler further comprises magnesium oxide, zinc oxide, silicon dioxide or titanium dioxide.

11. A heat dissipation substrate, comprising:
a first metal layer;
a second metal layer; and
a crosslinked heat conductive dielectric polymer material layer comprising the heat conductive dielectric material of claim 1, wherein the crosslinked heat conductive dielectric polymer material layer is disposed between and in physical contact with the first metal layer and the second metal layer;
wherein the heat dissipation substrate has a thickness greater than 0.1 mm and is capable of withstanding a voltage greater than 2000 volts.

12. The heat dissipation substrate of claim 11, wherein the first metal layer and the second metal layer are made by the group consisting of copper, aluminum, nickel, copper alloy, aluminum alloy, nickel alloy, copper nickel alloy, and copper aluminum alloy.

13. The heat dissipation substrate of claim 11, wherein the peeling strength between the crosslinked dielectric layer and the metal layer is greater than 1.0 kg/cm.

* * * * *